US005109572A

United States Patent [19]

Park

[11] Patent Number: 5,109,572

[45] Date of Patent: May 5, 1992

[54] LOCKING HINGE DEVICE FOR THE LCD SCREEN OF A WORD PROCESSOR

[75] Inventor: Kyung Park, Kyeongki-do, Rep. of Korea

[73] Assignee: Hyundai Electronics Ind. Co., Ltd., Kyeongki-do, Rep. of Korea

[21] Appl. No.: [illegible]86,225

[22] Filed: Sep. 21, 1990

[30] Foreign Application Priority Data

Sep. 23, 1989 [KR] Rep. of Korea ...... 13934 UM 89[U]

[51] Int. Cl.[5] ........................ E05D 11/10; H05K 7/16

[52] U.S. Cl. ........................................ 16/334; 16/341; 361/393; 248/921

[58] Field of Search .................. 364/708; 16/322, 334, 16/335, 336, 341; 248/918, 920, 921, 922, 923, 291; 361/380, 392, 393, 394, 395, 399

[56] References Cited

U.S. PATENT DOCUMENTS

| | | | |
|---|---|---|---|
| 324,444 | 8/1885 | Wolf | 16/322 |
| 521,429 | 6/1894 | Bessonette | 16/322 |
| 4,506,408 | 3/1985 | Brown | 16/342 X |
| 4,718,127 | 1/1988 | Rittmann et al. | 16/334 X |
| 4,785,190 | 11/1988 | Frankena | 248/291 X |

FOREIGN PATENT DOCUMENTS

| | | | |
|---|---|---|---|
| 60-225919 | 11/1985 | Japan | 364/708 |
| 61-19831 | 2/1986 | Japan . | |
| 62-89023 | 6/1987 | Japan . | |
| 62-96730 | 6/1987 | Japan . | |
| 63-151032 | 10/1988 | Japan . | |
| 63-199321 | 12/1988 | Japan . | |
| 64-54121 | 4/1989 | Japan . | |
| 64-54125 | 4/1989 | Japan . | |
| 1-61722 | 4/1989 | Japan . | |
| 1-68520 | 5/1989 | Japan . | |

OTHER PUBLICATIONS

Epson "Equity LT" brochure, CPD-657-IR-3/-88-250,000-1390-Rice, Mar., 1988.

*Primary Examiner*—Leo P. Picard
*Assistant Examiner*—Michael W. Phillips
*Attorney, Agent, or Firm*—Burns, Doane, Swecker & Mathis

[57] ABSTRACT

A locking hinge device for adjusting the screen viewing angle of a word processor includes a hinge pin to which a keyboard cover is hinged. The keyboard cover has an LCD screen fixed to the front face thereof. The elongated hinge members are integrally formed with the keyboard cover and hinged to the hinge pin. The hinge members have axial bores. The axial bores are constructed to include circumferentially arranged recesses that receive detents which provide a corresponding number of stationary positions for providing different operator viewing angles over a wide range of adjustment. Restraint members are provided with circumferentially arranged detents on the outer circumference thereof for being positioned in the corresponding detent receiving recesses.

5 Claims, 3 Drawing Sheets

LOCKING HINGE DEVICE FOR THE LCD SCREEN OF A WORD PROCESSOR

BACKGROUND OF THE INVENTION

This invention relates to a positioning apparatus and more particularly to a locking hinge device for adjusting the degree of the tilt of the liquid crystal display (LCD) screen of a word processor.

In using word processors, it becomes more essential to make such devices more convenient and comfortable for an operator to use. For this purpose, an operator has to be able to alter the viewing angle of the screen surface to obtain the desired angle of tilt on the screen.

Normally, the prior art word processor has a tilt mechanism wherein a liquid crystal display (LCD) screen support hinge member is hinged to a hinge support base by means of torsion springs. The LCD screen support hinge member is tilted to adjust the viewing angle and held in the desired tilt position by the frictional force of the torsion springs.

This type of arrangement has been found to require complex construction. Also, in the proper functioning of the tilt mechanism, it is essential that the elasticity of the torsion springs has a suitable degree, i.e. neither too little, as the positioning of the screen then may be changed inadvertently, nor too large, as the positioning gets stiff and difficult.

Furthermore, the elasticity of the torsion spring will be lowered over a long term of use, thus preventing the tilt screen from being positioned in the desired tilt position with maximum stability.

Accordingly, it is an object of the present invention to provide a locking hinge device which is of simple construction.

It is another object of the present invention to provide a locking hinge device which enables the screen to be retained in the desired tilt position with maximum stability over a long period of use.

SUMMARY OF THE INVENTION

The word processor with which the locking hinge device is utilized comprises a base with a key board fixed to the front upper face thereof, and a keyboard cover hinged to the keyboard by means of the locking hinge device with an LCD screen fixedly secured to the inner face thereof.

The locking hinge device includes a horizontal elongated pivot pin fixed to the rear of the keyboard in a direction of the longitudinal axis of the keyboard. The locking hinge device further includes a pair of elongated hinge members fixed to the opposite ends of the cover, each of which has an axial bore extending therethrough provided with detent receiving recesses in the inwardly facing surfaces thereof to provide a corresponding number of stationary positions for providing different operation viewing angles over a wide range of adjustment.

Additionally, a pair of resilient restraint members of substantially ring shape are provided to be fixed to the opposite ends of the pivot pin through the axial bores in the hinge members. Each of the restraint members is constructed to have circumferentially arranged detents extended from the periphery thereof to engage the detent receiving recesses in the bores.

The objects and features of the present invention are set forth with particularity in the appended claims. The present invention may be best understood by reference to the following description, taken in connection with the accompanying drawings in which like numerals indicate like parts.

DETAILED DESCRIPTION OF THE INVENTION

Figure 1:
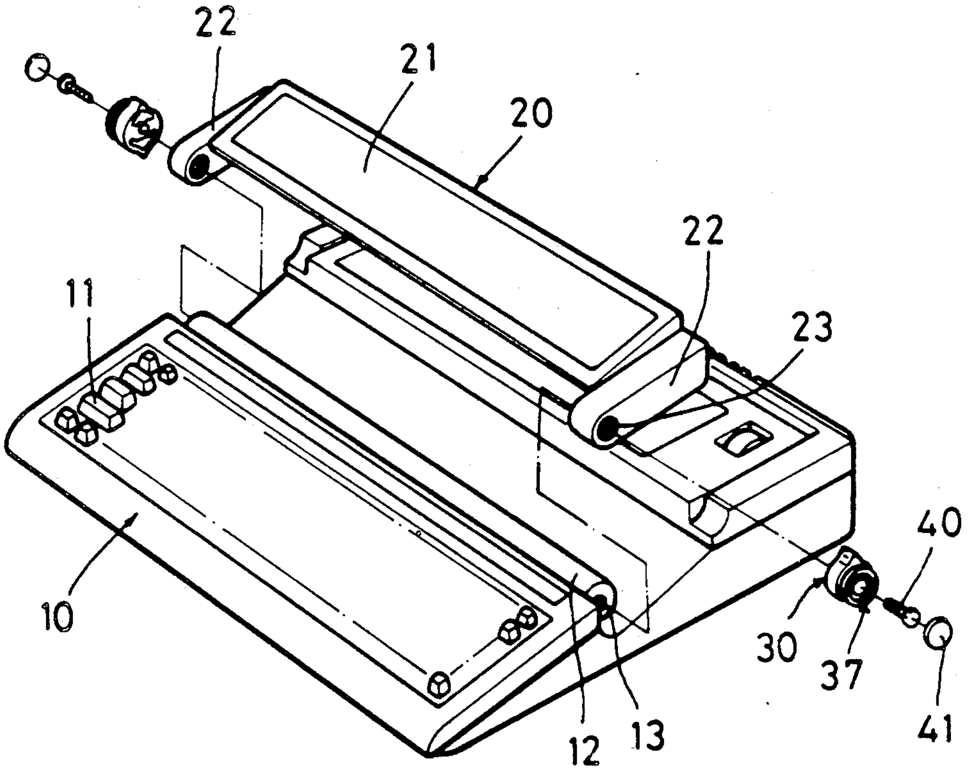
FIG. 1 is a perspective view of the locking hinge device of the present invention as utilized with a word processor.
Figure 2:
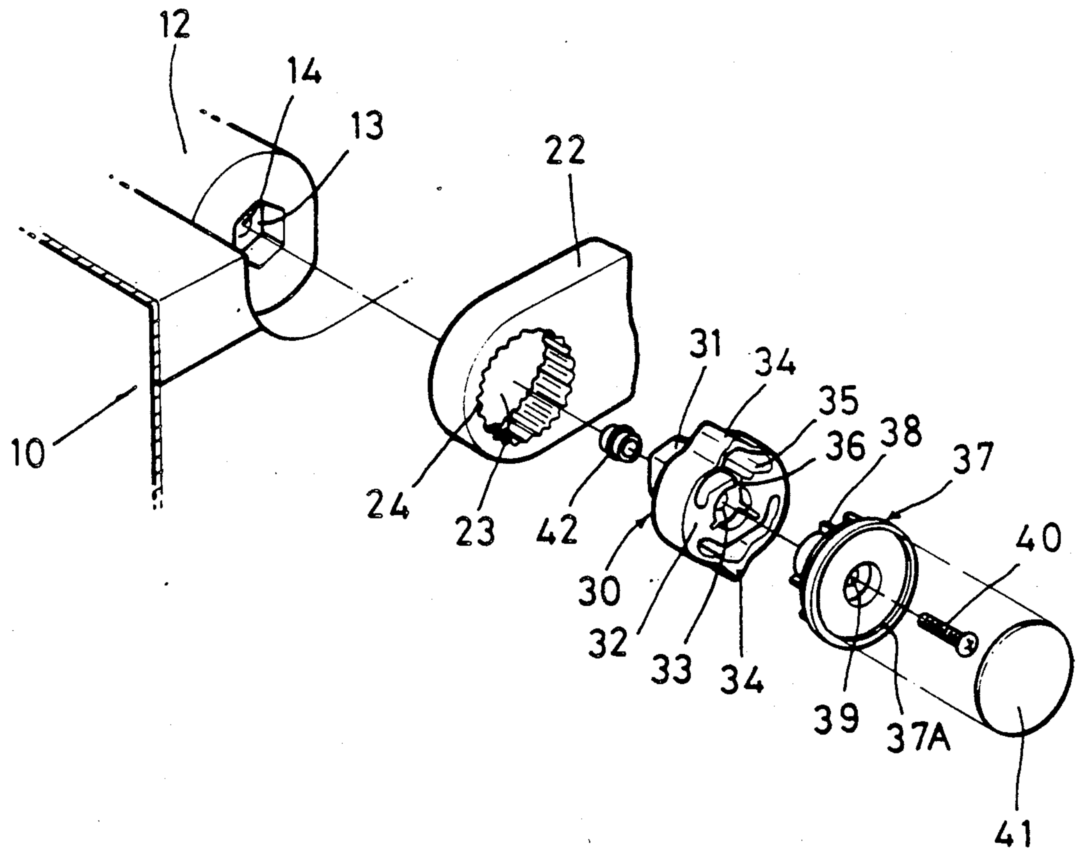
FIG. 2 is an exploded perspective view, in enlargement, of an essential part of the locking hinge device of the present invention.
Figure 3:
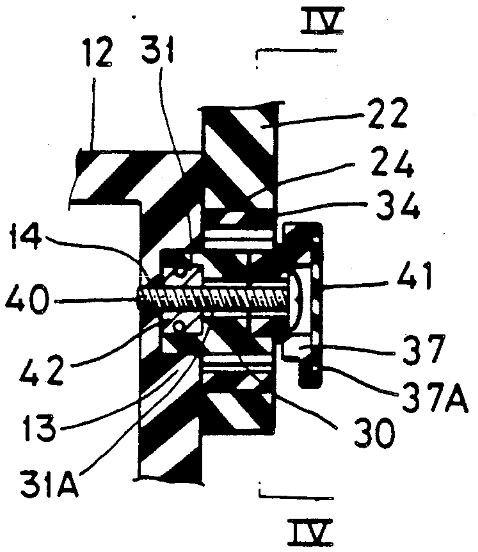
FIG. 3 is a sectional view of the essential part of the locking hinge device of the present invention.
Figure 4:
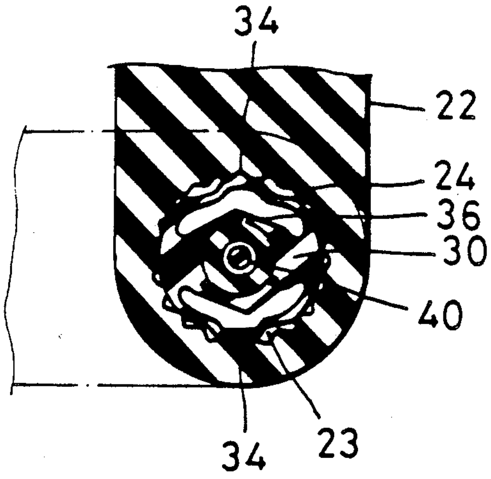
FIG. 4 is a sectional view of the part of the locking hinge device of FIG. 1, taken in the direction indicated by the line IV—IV of FIG. 3.

Referring to the drawings, a word processor associated with the locking hinge device of the present invention comprises a base 10, a keyboard cover 20 and the locking hinge device. A keyboard 11 is fixed to the front upper face of the base 10 and the liquid crystal display (LCD) screen 21 is fixed to the inner face of the keyboard cover 20. The keyboard cover 20 is hinged to the keyboard 11 and adjusted in position by the locking hinge device. The keyboard cover 20 is horizontally positioned over the keyboard 11 when closed.

The locking hinge device comprises a horizontal pivot pin 12 which is fixed to the rear of the keyboard 11 in a direction of the longitudinal axis of the keyboard 11 and a pair of elongated hinge members 22 fixed to the opposite sides of the keyboard cover 20. The keyboard cover 20 is in pivotable and openable relationship with respect to the keyboard 11.

The horizontal pivot pin 12 has non-circular recesses 13 in the opposite ends. Each non-circular recess 13 has an inwardly extending threaded hole 14. A pair of elongated hinge members 22 are composed of plastic material for wear-resistance purpose. Each elongated hinge member 22 includes an axial bore 23 extending therethrough provided with detent receiving recesses 24 in the inwardly facing surfaces thereof for providing different positions of the tilt angle of the LCD screen.

A pair of resilient members 30 have non-circular protrusions 31 for being fitted into the matching, aligned recesses 13 in the horizontal pivot pin 12 through the axial bores 23 in the hinge members 22. The pair of resilient restraint members 30 are also constructed of plastic material for wear-resistance purpose. Each restraint member 30 further includes a substantially wheel shaped portion 32 to be received in the corresponding one of the matching aligned axial bores 23. The particular spatial configuration of each lateral protrusion 31 and of its matching recess 13 embodied in the herein described preferred embodiment can be readily varied without departing from the spirit of the invention.

Each wheel shaped portion 32 includes a circumferentially arranged pair of detents 34 extended from the periphery thereof to be positioned in the corresponding one of the detent receiving recesses 24 when the rotation of the elongated hinge members 22 with respect to the wheel shaped portion 32 stops. Each wheel shaped portion 32 further includes a central hole 33 for receiving a screw 40 and comparatively larger slots 35 adjacent to the detents 34. It should be noted that although the pairs of detents 34 and slots 35 are shown, more detents and spaces are possible and contemplated as within the scope of the invention.

The assembly is complete by press fitting the lateral protrusions 31 of the restraint members 30 into the matching recesses 13 in the horizontal pivot pin 12 through the axial bores 23 in the elongated hinge members 22 and screwing the screws 40 in the threaded hole 14.

Figure 5:
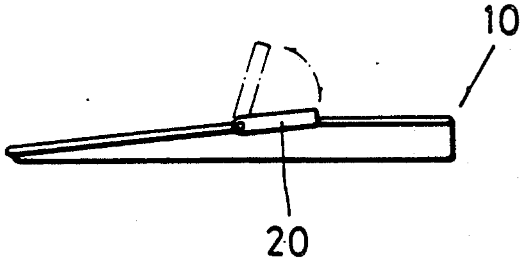
FIG. 5 is a side view of the locking hinge device in operation.

The operation of the locking hinge device of the present invention will now be discussed. To get the desired amount of tilt adjustment, the operator moves the keyboard cover 20 in the directions indicated by the arrows as shown in FIG. 5 which causes the elongated hinge members 22 to rotate about the restraint members 30. This results in the engagement of the detents 34 with the recesses 24 corresponding recesses 24. When the operator adjusts the keyboard cover 20, the detents 34 are made to come to rest in the corresponding recesses 24, whereby the changes in the screen viewing angle he wants may be accomplished.

It should be noted that the rotation of the elongated hinge members 22 for adjusting the degree of tilt of the screen of the word processor is made by means of the detents and their matching detent receiving recesses rather than by frictional force, thus making the tilt-angle adjustment easy. Also, it should be noted that the elongated hinge members 22 and the restraint members 30 are composed of plastic material having a wear-resistant characteristic. The resiliency applied to the locking hinge device will last throughout a long period of use.

It is within the scope of the invention to provide a constraint-force adjusting means 37 for adjusting the resilient constraint-force between the detents 34 and matching detent receiving recesses 24. For the purpose of adjusting the resilient constraint, enlargeable slits 36 may be provided in the wheel shaped portion 32 of the restraint members 30 for receiving eccentrically located axially elongated interlocking pins 38. The constraint-force adjustment means further includes central holes 39 for receiving the screws 40.

The degree of insertion of the interlocking pins 38 into the slits 36 varies by the locking force by the operator. Thereby, the resiliency of the detents 34 with respect to the detent receiving recesses 24 will be adjusted.

It is also within the scope of the invention that the non-circular protrusions 31 are provided with threaded central holes 31A with which nuts 42 are threaded.

When assembled, the screws 40 are threaded with the nuts 42, thereby the secure engagement of the restraint members 30 and the constraint-force adjusting wheels 37 is provided.

Furthermore, it is within the scope of the invention that each of the constraint-force adjusting means 37 have a peripheral grooves 37A for fittingly receiving circular snap-in cover 41 for preventing the screws 40 and other members from being seen from the outside.

While in accordance with the provisions and statutes there has been illustrated and described the best form of the invention, certain changes may be made without departing from the spirit of the invention as set forth in the appended claims and in some cases, certain features of the invention may be used to advantage without a corresponding use of other features.

What is claimed is:

1. A locking hinge device for adjusting the screen viewing angle of a word processor having a base and a keyboard cover hinged to the base, the base having a key board fixedly mounted to the front upper face thereof, the keyboard cover having a liquid crystal display (LCD) screen fixedly mounted to the front face thereof, said locking hinge device comprising:

a horizontal pivot pin attachable to the mid-portion of the upper face of said base rearwardly to said keyboard and extending substantially between the opposing ends of said base;

a pair of elongated hinge members attachable to the opposing ends of said keyboard cover, each of said elongated hinge members having an axial bore at the front end thereof, said axial bore having circumferentially arranged detent receiving recesses on the inner circumference thereof for providing different positions of tilt-angle;

a pair of resilient restraint members fixed to the opposite ends of said pivot pin, each restraint member including a substantially wheel shaped portion received and retained in said axial bore, said substantially wheel shaped portion including a plurality of circumferentially arranged detents on the outer circumference thereof for being positioned in the corresponding ones of said circumferentially arranged recesses, a central bore receiving adjusting screws, slots provided between said central bore and said detents, and slits in communication with said slots and said central bore; and constraint-force adjusting means having eccentrically located axially elongated interlocking pins received in said slits in said restraint members.

2. A locking hinge device according to claim 1, wherein said horizontal pivot pin has opposing recesses at the opposite ends thereof and each of said restraint members further having a matching protrusion for being fittingly received in the matching one of said opposing recesses, and each of said opposing recesses having an inwardly extending threaded hole.

3. A locking device according to claim 2, wherein said opposing recesses and their matching protrusions have a non-circular shape in their cross-sections.

4. A locking hinge device according to claim 2, wherein a nut receiving hole is located in said matching protrusion of each of said restraint members receiving a nut, whereby said restraint members are fixed to said horizontal pivot pin by receiving said screw through said nut in said threaded hole.

5. A locking hinge device according to claim 1, wherein peripheral grooves are located in the periphery of said restraint members, said device further comprising cover means fittingly engaging said grooves.

* * * * *